(12) United States Patent
Leroux et al.

(10) Patent No.: US 8,523,578 B2
(45) Date of Patent: Sep. 3, 2013

(54) ELECTRONIC EQUIPMENT WITH DOCKING MEANS FOR RECEIVING AN EXTRACTABLE ELEMENT

(75) Inventors: Gérard Leroux, Rueil-Malmaison (FR); Dominique Susini, Rueil-Malmaison (FR); Didier Venom, Rueil-Malmaison (FR)

(73) Assignee: Sagemcom Broadband SAS, Rueil-Malmaison (FR)

( * ) Notice: Subject to any disclaimer, the term of this patent is extended or adjusted under 35 U.S.C. 154(b) by 135 days.

(21) Appl. No.: 13/124,959

(22) PCT Filed: Nov. 24, 2009

(86) PCT No.: PCT/FR2009/001339
§ 371 (c)(1),
(2), (4) Date: Apr. 19, 2011

(87) PCT Pub. No.: WO2010/061075
PCT Pub. Date: Jun. 3, 2010

(65) Prior Publication Data
US 2011/0201218 A1    Aug. 18, 2011

(30) Foreign Application Priority Data
Nov. 28, 2008    (FR) ...................................... 08 06695

(51) Int. Cl.
*H01R 12/00* (2006.01)
*H05K 1/00* (2006.01)
(52) U.S. Cl.
USPC ............................................ 439/64; 439/377

(58) Field of Classification Search
USPC .................. 439/64, 377, 83, 59; 361/679.33, 361/679.37, 679.38
See application file for complete search history.

(56) References Cited

U.S. PATENT DOCUMENTS

| 5,297,966 | A | * | 3/1994 | Brennian et al. | 439/64 |
| 5,451,168 | A | | 9/1995 | Shuey | |
| 5,747,735 | A | | 5/1998 | Chang et al. | |
| 6,095,862 | A | * | 8/2000 | Doye et al. | 439/607.11 |
| 6,135,792 | A | * | 10/2000 | Kuo | 439/92 |
| 6,319,017 | B1 | * | 11/2001 | Kuo | 439/64 |
| 6,377,448 | B1 | | 4/2002 | Liu et al. | |
| 6,454,580 | B1 | * | 9/2002 | Hwang | 439/138 |
| 6,736,671 | B2 | * | 5/2004 | Lee | 439/541.5 |
| 6,764,323 | B2 | * | 7/2004 | Shimada et al. | 439/138 |
| 2004/0223421 | A1 | | 11/2004 | Matsumura et al. | |
| 2012/0244741 | A1 | * | 9/2012 | Lim et al. | 439/377 |

* cited by examiner

*Primary Examiner* — Hae Moon Hyeon
(74) *Attorney, Agent, or Firm* — Muncy, Geissler, Olds & Lowe, PLLC

(57) ABSTRACT

An equipment provided with a docking device for receiving an extractable element comprising a housing carrying a pluggable connector and having at least one grounding surface, the equipment comprising a printed circuit card carrying a device including a central body from which there extend two parallel rails for slidably receiving side portions of the housing, and a connector having tabs soldered to the printed circuit while being arranged to co-operate with the pluggable connector of the extractable element in the sliding direction, and at least one contact element comprising a fastener tab soldered to the printed circuit, the contact element being electrically conductive and being arranged to be pressed against the grounding surface while the extractable element is being put into place in the equipment.

13 Claims, 3 Drawing Sheets

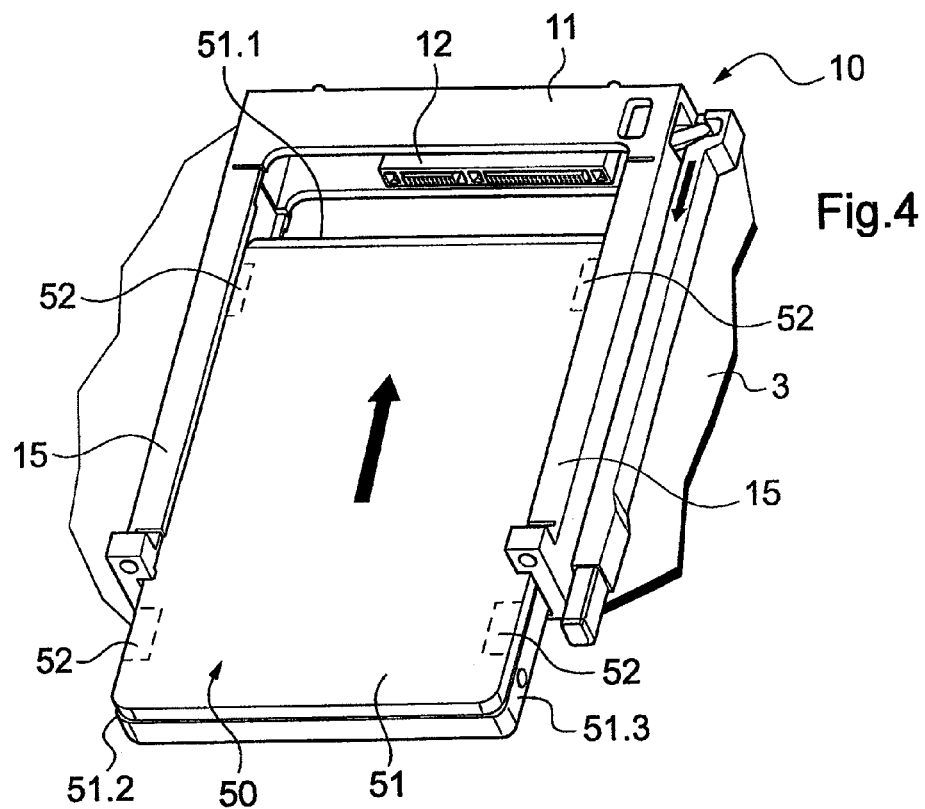
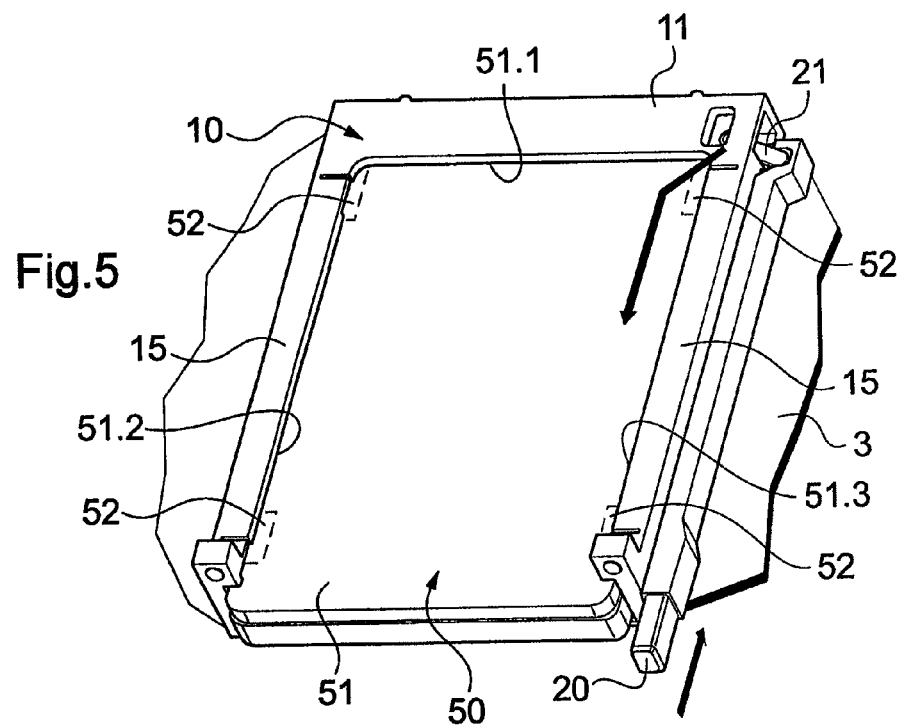

ELECTRONIC EQUIPMENT WITH DOCKING MEANS FOR RECEIVING AN EXTRACTABLE ELEMENT

FIELD OF THE INVENTION

The present invention relates to a device for receiving a hard disk and to electronic equipment fitted with such a device. Such equipment may be constituted, for example, by audiovisual equipment, such as a decoder or an optical reader for reading a disk of the digital video disk (DVD) type, for connection to a television (TV) set, and having the ability to record TV programs on a hard disk.

BACKGROUND OF THE INVENTION

A hard disk generally comprises a housing having mounted therein: a magnetic disk; a read/write module for the magnetic disk; and a motor for driving the disk. The read/write module and the motor are connected to a control unit located inside the housing and connected to a pluggable connector secured to the housing. Since the operation of such a disk generates electromagnetic disturbances, grounding surfaces are provided on the housing, which surfaces are machined so as to be thoroughly plane and smooth, and each of them has a tapped well formed therein. The arrangement and the positioning of the grounding surfaces are standardized. The hard disk is fastened in the equipment for which it is intended by screws that pass through an electrically conductive chassis of the equipment and that are engaged in the tapped wells in such a manner as to establish electrical contact between the grounding surfaces and the conductive chassis that is itself connected to ground. Replacing the hard disk contained in the equipment with another hard disk requires action to be taken by a qualified person.

Proposals have been made to provide equipment having extractable hard disks. The housing of the hard disk is then screwed into a cradle provided with means for making a connection to the hard disk and to the electronic portion of the equipment, the cradle being removably received in the chassis of the equipment. Such equipment is not arranged to enable the hard disk to be replaced by a user having no particular technical knowledge.

OBJECT AND SUMMARY OF THE INVENTION

The invention seeks to enable such a user to replace the hard disk of a piece of equipment with a hard disk purchased separately, the hard disk being conventional and not including any particular arrangements to make it interchangeable by the user.

To this end, the invention provides equipment provided with docking means for receiving a hard disk comprising a housing carrying a pluggable connector and having at least one grounding surface, the equipment including a printed circuit carrying a device including a central body from which there extend two parallel rails for slidably receiving side portions of the housing, and a connector having tabs soldered to the printed circuit while being arranged to co-operate with the pluggable connector of the hard disk in the sliding direction, and at least one contact element comprising a fastener tab soldered to the printed circuit, the contact element being electrically conductive and being arranged to be pressed against the grounding surface while the hard disk is being put into place in the equipment.

Thus, the hard disk is put into place merely by engaging the housing of the hard disk between the rails of the device without any need for any kind of manipulation of fastener screws. The connection of the hard disk to the connector of the device and the grounding of the housing are performed in a manner that is transparent to the user, merely by engaging the hard disk between the rails. Removing the hard disk is just as simple.

Advantageously, the connector and the contact elements are fastened to the printed circuit independently of one another, and/or by soldering.

Preferably, the contact element includes a support having a fastener portion passing through a portion of the rail and at least one contact blade that extends inside the rail and that is elastically deformable to allow the housing to pass while being pressed thereagainst.

The elastically deformable contact blade serves to provide reliable contact with the grounding surface in the event of vibration or of small variations of thickness between the housing of the hard disk that the device is to receive.

Advantageously, the rails are of channel section, comprising a web and two flanges, and the fastener portion passes through one of the flanges of the rail to which the contact element is fastened.

The conductor element bears against two opposite faces of the side portion received in the rail.

Also advantageously, the fastener portion is barb-shaped.

The barb shape provides mechanical fastening.

According to a particular characteristic, the equipment includes a sliding ejector lever for ejecting the hard disk, the ejector lever extending along one of the rails and having a first end adjacent to a free end of the rail and a second end adjacent to the central body and connected to said rail or to said body by a link arranged to bear against an end portion of the disk housing.

This makes it easier to withdraw the hard disk. Preferably, the stroke of the lever is sufficient to enable the hard disk connector to be completely disengaged from the connector of the device.

The invention also provides equipment including a chassis receiving an electronics unit having a printed circuit card on which a device of the invention is mounted in such a manner that each of the rails presents an end remote from the central body that projects outside the chassis.

Advantageously, the fastener tabs are electrically connected to a ground of the printed circuit card.

The fastener tabs then perform an additional function of conducting electricity to connect the conductor elements to the ground of the equipment.

BRIEF DESCRIPTION OF THE DRAWINGS

Other characteristics and advantages of the invention appear on reading the following description of a particular, non-limiting embodiment of the invention.

Reference is made to the accompanying drawings, in which:

FIGS. 4 and 5 are perspective views of the device showing a hard disk being inserted and a hard disk in place.

DETAILED DESCRIPTION OF THE PREFERRED EMBODIMENTS

Figure 1:
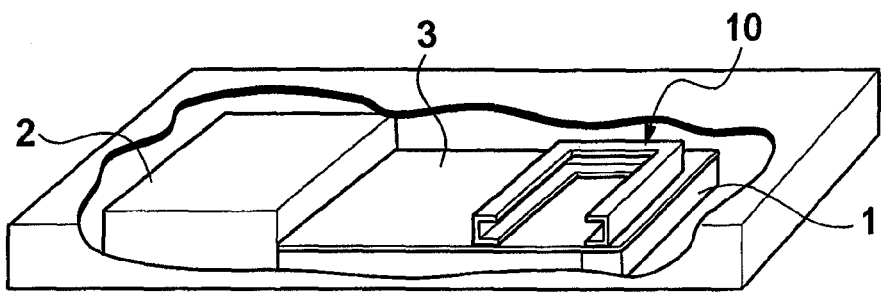
FIG. 1 is a cutaway diagrammatic perspective view of equipment in accordance with the invention.
Figure 2:
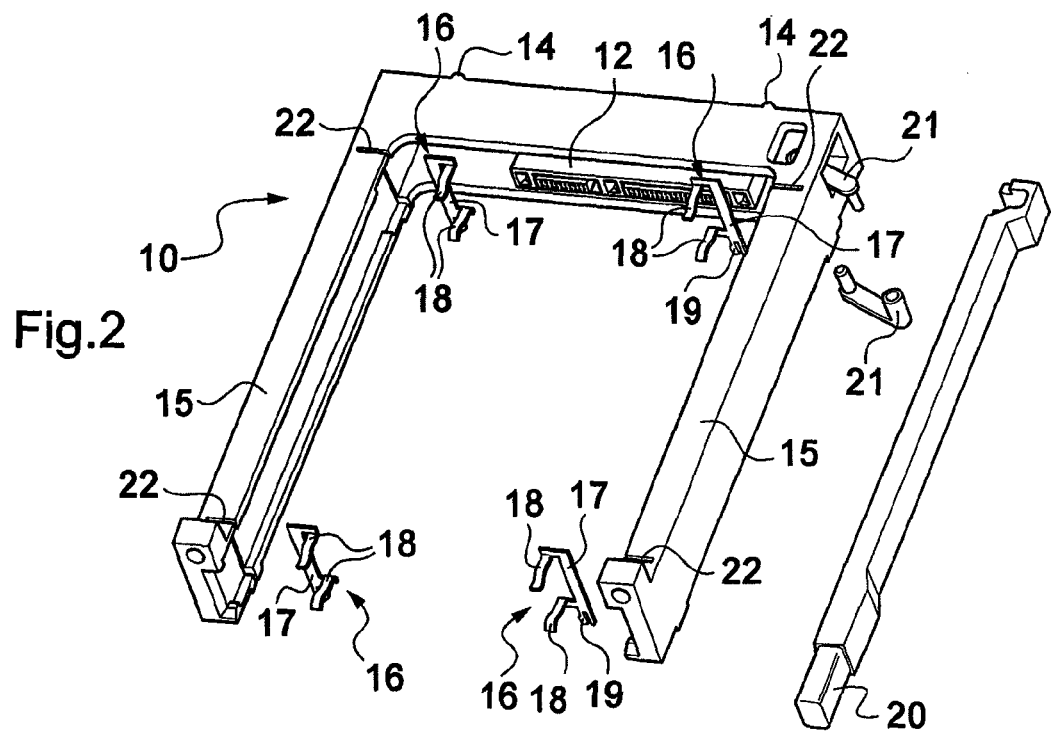
FIG. 2 is an exploded perspective view seen from above of a device in accordance with the invention fitted to said equipment.
Figure 3:
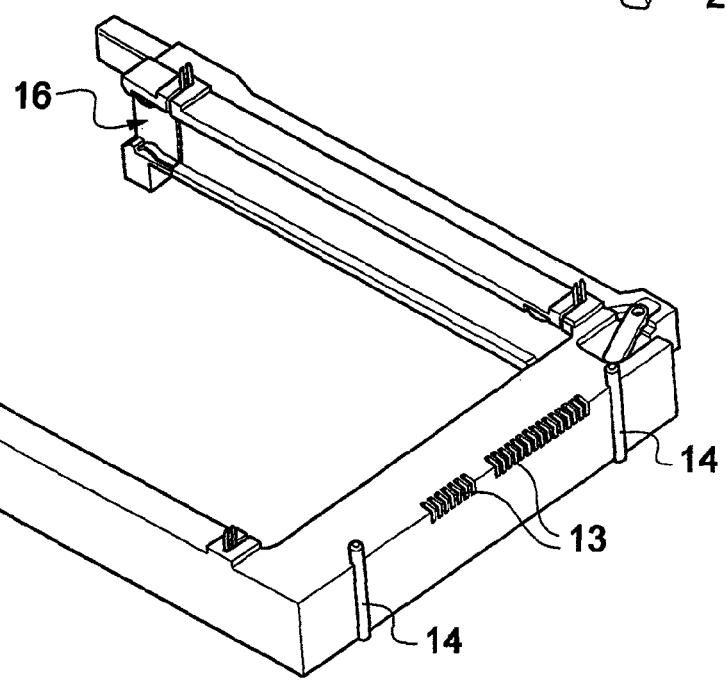
FIG. 3 is a perspective view of the device as seen from beneath.

With reference to the figures, the device in accordance with the invention comprises a chassis 1 receiving an electronics unit 2 comprising a printed circuit card 3 having electronic components (not shown herein) fastened thereon. By way of example, the equipment is a piece of audiovisual equipment, such as a decoder or an optical reader for reading a disk of the DVD type, for connection to a television set, and having the ability to record TV programs on a hard disk. The electronics unit 2 thus comprises for example: a radio receiver; a memory; and a control module that is programmed to display menus enabling the receiver to be adjusted, enabling recordings to be programmed and viewed, . . . .

For recording, the equipment is provided with a hard disk 50, itself known, comprising a housing 51 of rectangular shape that is provided with an external connector plug, hereof the serial advanced technology attachment (SATA) type (not shown in the figures) that is available in a side 51.1 of the housing 51, and also provided with grounding surfaces 52. The arrangement and the positioning of the grounding surfaces 52 are standardized. The grounding surfaces 52 are located close to the sides 51.2 and 51.3 of the housing 51 that are perpendicular to the side 51.1: four grounding surfaces 52 are provided on the top face of the housing 51 and four grounding surfaces 52 are provided in corresponding manner on the bottom surface of the housing 51. These grounding surfaces 52 are electrically conductive and they are machined so as to be plane and smooth, thereby enabling a reliable electrical contact to be established.

The hard disk 50 is received in removable manner in a docking device given overall reference 10 and mounted on the printed circuit card 3. The docking device comprises a central body 11 having a channel section with a web and two flanges that are spaced apart to receive between them the side 51.1 of the housing 51. The web carries a connector 12 having connection tabs 13 passing through an opening in the bottom flange so as to project outside the body and be connected to connection areas of the circuit on the printed circuit card 3. The connection tabs may be perpendicular or parallel to the flanges of the central body 11. The back of the web of the central body 11 is provided with transverse ribs forming guide pegs 14 enabling the device to be positioned on the printed circuit card 3.

Two rails 15 extend from ends of the central body 11, away from its web, the two rails 15 being parallel to each other and perpendicular to the central body 11. The rails 15 are of channel section, each having a web and two flanges that are spaced apart to receive between them a respective one of the sides 51.2 and 51.3 of the housing 51. The central body 11 and the rails 15 define a U-shaped frame that covers three consecutive sides of the housing 51. The central body 11 and the rails 15 in this example are formed as a single injection molding, e.g. being made of a glass fiber filled thermoplastic polyester (of the polybutylene terephthalate PBT type).

Conductor elements 16 are mounted in the flanges of the rails 15 in order to extend in register with the grounding surfaces 52 when the housing 51 is received between the rails 15. Each conductor element 16 has a support 17 that extends perpendicularly to the flanges, being embedded in the web of the rail 15, and having ends that are secured to elastically deformable contact blades 18 that extend in the vicinity of the flanges, parallel thereto. The contact blades 18 are curved in such a manner that when in the rest position they define between them a distance that is less than the thickness of the housing 51, and when in the deformed state they are flattened so as to define a distance that is equal to the thickness of the housing 51. A fastener tab 19 extends the support 17 so as to pass through the bottom flange of the rail 15 and project beyond it. The fastener portion 19 is barb-shaped and it is engaged in a slot 22 formed in the flange going from a free edge thereof to the web. Preferably, the fastener tab 19 is a tight-fit in the slot 22 so as to hold the conductor element 16 in the rail 15 before the device is fastened to the integrated circuit card.

The device includes an ejector lever 20 for ejecting the hard disk. The lever 20 is mounted to slide along the web of one of the rails 15 and has a first end adjacent to a free end of the rail 15 and a second end adjacent to the central body 11, which second end is connected to the central body 11 by links 21 arranged to bear against an end portion of the hard disk housing 51 when it is engaged in the device.

Initially, the device is clipped onto the printed circuit card 3, the connection tabs being engaged in holes formed in register with the ground connection areas of the circuit on the printed circuit card (the barb shape serves to retain the device resiliently on the printed circuit card). The bottom flanges of the rails 15 are pressed against the printed circuit card 3. The connection tabs 19 are then soldered to the printed circuit card, as are the connection tabs of the connector 12: the material constituting the central body 11 and the rails 15 must therefore be capable of withstanding soldering temperature.

The device is positioned in the equipment in such a manner that the free ends of the rails 15 and the first end of the lever 20 project out from the chassis so as to be accessible to the operator, and preferably without requiring any particular disassembly.

While the hard disk is being put into place, the contact blades 18 are deformed elastically so as to allow the housing to pass, the blades then being pressed thereagainst. The connector 12 co-operates with the pluggable connector of the hard disk in the sliding direction, thereby enabling the two connectors to be connected together.

The hard disk is withdrawn by actuating the ejector lever.

Naturally, the invention is not limited to the embodiment described but covers any variant coming within the ambit of the invention as defined by the claims.

In particular, instead of being elastically deformable, the conductor elements may be movable mechanically between a retracted inactive position and a contact position in which they project into the rail, e.g. under drive from a cam projecting into the rail and moved by the housing while it is being inserted into the device.

Furthermore, the device may be positioned on and fastened to the printed circuit in a manner that is completely independent of the connector, and/or of the contact elements that serve to provide grounding.

Figure 6:
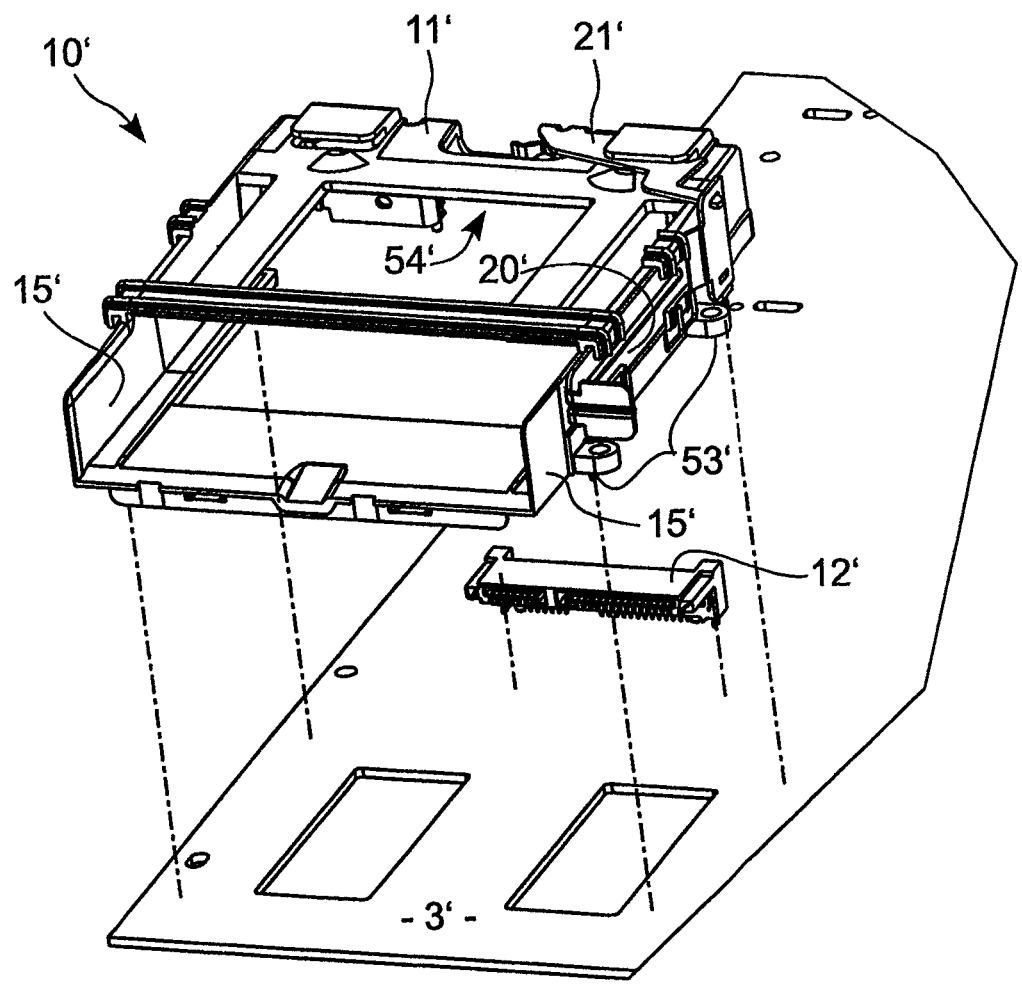
FIG. 6 is a perspective view of a variant device of the invention.

This variant is shown in FIG. 6 and also includes a docking device 10' in the form of a central body 11' extended by two parallel rails 15', the device being associated with a connector 12' and both the device and the connector being designed to be mounted on a printed circuit card 3'. These members are of general shapes that are analogous to those of the corresponding members of the embodiment shown in the other figures.

The contact elements (not shown) may be merely soldered to the printed circuit in order both to fasten them and to connect them electrically, so there is no need for the contact elements to include barb-shaped ends.

The device 10' may be fitted with side tabs 53' serving solely for fastening it. Each tab is then in the form of a metal tongue that is rigidly secured to a rail 15' of the body of the device 10', and presents an end with a barb shape projecting from the bottom face of the device 10'.

In addition, the device 10' may be provided with a recess 54' situated in its central body 11' and suitable for receiving the connector 12'. The connector 12' is then advantageously provided with metal tabs having barb-shaped ends that are dedicated solely to fastening it, while also including connection tabs that need to be connected to connection areas on the circuit of the printed circuit card 3' by soldering.

The assembly can then be mounted by soldering the contact elements, then by fastening the connector 12', prior to fastening the device 10'. Fastening the connector 12' may consist in engaging the ends of its fastener tabs in corresponding holes in the printed circuit, and in analogous manner, fastening the device may likewise consist in engaging the ends of its barb-shaped fastener tabs in other corresponding holes in the printed circuit.

An additional soldering operation may optionally be provided for the purpose of soldering the printed circuit 3' to the barb-shaped ends of the various fastener tabs of the connector and of the device.

The ejector lever may be omitted, with the hard disk being withdrawn by taking hold of the housing directly, or it may be replaced by some other type of lever, e.g. a rocking lever.

In a variant, the conductor elements may be fastened by any means to the rails, e.g. by crimping, clipping, adhesive, . . . .

The electrical connection of the conductor elements to the ground of the circuit on the printed circuit card may be achieved by an independent dedicated portion of the connection tab.

What is claimed is:

1. An equipment provided with docking means for receiving an extractable element comprising a housing carrying a pluggable connector and having at least one grounding surface, the equipment comprising a printed circuit card carrying a device including a central body from which there extend two parallel rails for slidably receiving side portions of the housing, and a connector having tabs soldered to the printed circuit while being arranged to co-operate with the pluggable connector of the extractable element in the sliding direction, and at least one contact element comprising a fastener tab soldered to the printed circuit card, the contact element being electrically conductive and being arranged to be pressed against the grounding surface while the extractable element is being put into place in the equipment.

2. The equipment according to claim 1, wherein the device, the connector, and the contact elements are fastened to the printed circuit card independently of one another.

3. The equipment according to claim 1, wherein the device, the connector, and the contact elements are fastened to the printed circuit card by soldering.

4. The equipment according to claim 1, wherein the contact element includes a support which is provided with the fastener tab and at least one contact blade that extends inside the rail and that is elastically deformable to allow the housing to pass while being pressed thereagainst, the fastener tab passing through a portion of the rail.

5. The equipment according to claim 1, wherein the rails are of channel section, comprising a web and two flanges, and wherein the fastener tab passes through one of the flanges of the rail to which the contact element is fastened.

6. The equipment according to claim 1, wherein the fastener tab is barb-shaped.

7. The equipment according to claim 1, including a sliding ejector lever for ejecting the extractable element, the ejector lever extending along one of the rails and having a first end adjacent to a free end of the rail and a second end adjacent to the central body and connected to said rail or to said body by a link arranged to bear against an end portion of the extractable element housing.

8. The equipment according to claim 1, wherein the connector possesses tabs for connection to the printed circuit card, which tabs extend parallel to or perpendicular to the rails.

9. The equipment according to claim 1, wherein the two side portions of the housing are provided on two opposite faces of two grounding surfaces, wherein the rails are of channel section each having a web and two flanges, each rail being provided with two contact elements, each comprising a support that extends perpendicularly to the flanges and has ends with contact blades secured thereto, the contact blades extending in the vicinity of the flanges and parallel thereto, the fastener tab extending the support and passing through a flange of the rail.

10. The equipment including a chassis receiving an electronics unit having the printed circuit card on which is mounted the device according to claim 1.

11. The equipment according to claim 10, wherein the fastener tab is electrically connected to a ground of the printed circuit card.

12. The equipment according to claim 10, wherein the device is mounted on the printed circuit card in such a manner that each of the rails presents an end remote from the central body that projects outside the chassis.

13. The equipment according to claim 10, comprising a sliding ejector lever for ejecting the extractable element, the ejector lever extending along one of the rails and having a first end extending outside the chassis and a second end adjacent to the central body and connected to said rail or to said body by a link arranged to bear against an end portion of the extractable element housing.

* * * * *